(12) United States Patent
Doi et al.

(10) Patent No.: US 7,746,060 B2
(45) Date of Patent: Jun. 29, 2010

(54) ATTACHMENT APPARATUS, TEST HEAD, AND ELECTRONIC DEVICE TEST SYSTEM

(75) Inventors: Atsuyuki Doi, Tokyo (JP); Yoshimasa Ito, Tokyo (JP)

(73) Assignee: Advantest Corporation, Tokyo (JP)

( * ) Notice: Subject to any disclaimer, the term of this patent is extended or adjusted under 35 U.S.C. 154(b) by 110 days.

(21) Appl. No.: 12/159,041

(22) PCT Filed: Dec. 26, 2006

(86) PCT No.: PCT/JP2006/325847

§ 371 (c)(1),
(2), (4) Date: Jun. 24, 2008

(87) PCT Pub. No.: WO2007/077807

PCT Pub. Date: Jul. 12, 2007

(65) Prior Publication Data

US 2009/0184720 A1 Jul. 23, 2009

(30) Foreign Application Priority Data

Dec. 28, 2005 (JP) .............................. 2005-379164

(51) Int. Cl.
*G01R 31/28* (2006.01)
(52) U.S. Cl. ...................... 324/158.1; 324/758; 324/537
(58) Field of Classification Search ............... 324/158.1, 324/758, 537, 578, 765; 439/61, 492, 578, 439/581

See application file for complete search history.

(56) References Cited

U.S. PATENT DOCUMENTS

| 5,191,282 | A | * | 3/1993 | Liken et al. ................ 324/537 |
| 5,754,057 | A | | 5/1998 | Hama et al. |
| 6,313,653 | B1 | | 11/2001 | Takahashi et al. |
| 7,671,614 | B2 | * | 3/2010 | Eldridge et al. ............. 324/758 |
| 2002/0070741 | A1 | | 6/2002 | Siew et al. |
| 2002/0106927 | A1 | | 8/2002 | Bosy et al. |
| 2007/0159532 | A1 | | 7/2007 | Kiyokawa |
| 2007/0200555 | A1 | | 8/2007 | Mizushima et al. |
| 2007/0206967 | A1 | | 9/2007 | Kikuchi et al. |
| 2007/0296432 | A1 | | 12/2007 | Mineo et al. |
| 2008/0042667 | A1 | | 2/2008 | Yamashita et al. |

FOREIGN PATENT DOCUMENTS

EP 0699913 3/1996

(Continued)

OTHER PUBLICATIONS

English language Abstract of TW 440699, Jun. 16, 2001.

(Continued)

*Primary Examiner*—Minh N Tang
*Assistant Examiner*—Trung Q Nguyen
(74) *Attorney, Agent, or Firm*—Greenblum & Bernstein, P.L.C.

(57) ABSTRACT

An apparatus comprises: an engagement shaft able to engage with a bottom surface of a DSA and held linear movably; an air cylinder supplying a drive force for linearly moving the engagement shaft; and a link mechanism interposed between the air cylinder and the engagement shaft and transmitting the drive force input from the actuator to the engagement shaft, and the link mechanism transmits the drive force input from the air cylinder by rotary motion.

10 Claims, 19 Drawing Sheets

FOREIGN PATENT DOCUMENTS

| | | |
|---|---|---|
| JP | 50-26998 | 3/1975 |
| JP | 50-026998 A | 3/1975 |
| JP | 1-178690 | 7/1989 |
| JP | 8-264603 | 10/1996 |
| JP | 11-352181 | 12/1999 |
| JP | 11-352181 A | 12/1999 |
| JP | 2000-035459 A | 2/2000 |
| TW | 440699 | 6/2001 |
| WO | 00/73807 | 12/2000 |

OTHER PUBLICATIONS

English language Abstract and translation of JP 11-352181 A, Dec. 24, 1999.
English language Abstract and translation of JP 2000-035459 A, Feb. 2, 2000.
English language Abstract of JP 8-264603, Oct. 11, 1996.
English language Abstract of JP 1-178690, Jul. 14, 1989.
English language Abstract of JP 11-352181, Dec. 24, 1999.

* cited by examiner

US 7,746,060 B2

ATTACHMENT APPARATUS, TEST HEAD, AND ELECTRONIC DEVICE TEST SYSTEM

TECHNICAL FIELD

The present invention relates to an attachment apparatus for attaching or removing a first board to or from a second board in a test head of an electronic device test system testing a semiconductor integrated circuit device or other device under test (hereinafter referred to as an "IC"), and a test head and electronic device test system comprising that attachment apparatus.

BACKGROUND ART

An electronic device test system conveys a large number of ICs held on a tray inside a handler, brings the ICs into electrical contact with sockets of a HiFix of a test head, and uses a tester to test them. Further, after finishing the tests, the ICs are classified into corresponding customer trays based on the categories of the test results.

A HiFix (interface apparatus) which relays electrical connections between the ICs under test which sides with the handler and the test head is mounted on the top of the test head. Further a DSA (device specific adapter) is mounted on the top of this HiFix. This DSA has a socket board etc. on which sockets are mounted for electrical contact with the input/output terminals of the ICs under test. This DSA is prepared in a variety of types in accordance with the types of the IC chips under test and has to be changed along with a change in the type of the IC chips. For this reason, a DSA attachment apparatus for attaching or detaching the DSA to or from the HiFix body is provided at the HiFix body.

As such a DSA attachment apparatus, a DSA attachment apparatus 540 using a cam mechanism shown in FIG. 13 and FIG. 14 has been known in the past. This attachment mechanism 540 comprises: a cam 542 attached to a linearly moving drive shaft 541a of an air cylinder 541; and a cam follower 545 attached to an engagement shaft 544 engageable with the DSA 501. Further, by the cam follower 545 rolling along a cam groove 543 formed at the cam 542 at a slant and the engagement shaft 544 engaged with the DSA 501 linearly moving in the downward direction, the DSA 501 is attached to the HiFix body 510. As opposed to this, by the engagement shaft 544 engaged with the DSA 501 moving linearly along the upward direction, the DSA 501 is detached from the HiFix body 510.

By the way, when attaching the DSA to the HiFix body, their connectors are coupled together whereby the DSA and the HiFix body are electrically connected. For that reason, for attachment, a predetermined force is required for coupling the connectors together. The number of connectors increases along with the increase of the number of simultaneous measurements in electronic device test systems in recent years and the force required for pushing the DSA toward the HiFix body at the time of attachment tends to increase.

In order to deal with this trend toward increase of the pushing force by the above mentioned DSA attachment apparatus 540 utilizing a cam mechanism, it is necessary to lengthen the cam groove 543 to increase the reduction ratio or increase the number of attachment apparatus. Further, in the above DSA attachment device 540, the drive force supplied from the air cylinder 541 is transmitted through linear contact of the cam follower 545 and the cam groove 543, so it is not possible to deal with the increase in pushing force unless strengthening the structure of the cam 542 and cam follower 545. For this reason, an increase in size of the attachment apparatus and higher costs are invited.

DISCLOSURE OF THE INVENTION

The present invention has as its object the provision of an attachment apparatus enabling achievement of smaller size and a test head and electronic device test system using the same.

To achieve the above object, according to the present invention, there is provided an attachment apparatus for attaching or removing a first board to or from a second board in a test head comprising the first board and a second board to which the first board is mounted, the attachment apparatus comprising: an engaging means able to engage with the first board and held linear-movably; an actuator supplying a drive force for linearly moving the engaging means; and a transmitting means interposed between the actuator and the engaging means and transmitting drive force input from the actuator to the engaging means; wherein the transmitting means transmits the drive force input from the actuator by rotary motion (see claim 1).

Further, to achieve the above object, according to the present invention, there is provided a test head comprising: a first board; a second board to which the first board is mounted; and an attachment apparatus for attaching or removing the first board to or from the second board, wherein the attachment device comprises: an engaging means able to engage with the first board and held linear-movably; an actuator supplying a drive force for linearly moving the engaging means; and a transmitting means interposed between the actuator and the engaging means and transmitting drive force input from the actuator to the engaging means, and the transmitting means transmits the drive force input from the actuator by rotary motion (see claim 9).

Furthermore, to achieve the above object, according to the present invention, there is provided an electronic device test system for testing electrical characteristics of devices under test, comprising: a test head electrically connected to the devices under test; and a tester inputting test signals to the devices under test through the test head to operate them and inspecting their response signals, wherein the test head comprises: a first board; a second board to which the first board is mounted; and an attachment apparatus for attaching or removing the first board to or from the second board, and the attachment device comprises: an engaging means able to engage with the first board and held linear-movably; an actuator supplying a drive force for linearly moving the engaging means; and a transmitting means interposed between the actuator and the engaging means and transmitting drive force input from the actuator to the engaging means, and the transmitting means transmits the drive force input from the actuator by rotary motion (see claim 10).

In the present invention, when transmitting a drive force from the actuator to the linear motion means, the transmitting means transmits the drive force input from the actuator by rotary motion. By having the transmitting means transmit the drive force by rotary motion, it is possible to configure the transmitting means smaller and possible to achieve greater compactness of the attachment apparatus.

While not particularly limited to this in the above invention, preferably the transmitting means increases the drive force input from the actuator and transmits it to the engaging means (see claim 2).

While not particularly limited to this in the above invention, preferably the transmitting means has a link mechanism whose a point to input the force is couples with a drive shaft of the actuator and whose a point to output the force (a point of action) is coupled with the engaging means (see claim 3).

By using a link mechanism as the transmitting means, it is possible to transmit the drive force supplied from the actuator through planar contact between the links and possible to further achieve greater compactness of the attachment apparatus.

As a specific configuration of the link mechanism, for example, the link mechanism comprises: a first link rotatably coupled with the drive shaft of the actuator through a first joint; a second link having a support point fixed in a rotatable manner and rotatably coupled with the first link through a second joint; and a third link rotatably coupled with the second link through a third joint and rotatably coupled with the engaging means through a fourth joint (see claim 4).

While not particularly limited to this in the above invention, the first board is a device specific adapter which are mounted with sockets which devices under test electrically contact, the second board is an interface apparatus body to which the device specific adapter is mounted, the interface apparatus body relays electrical connections between the devices under test and a test head body, and the engaging means is held at the interface apparatus body and is able to linearly move toward the device specific adapter (see claim 5).

While not particularly limited to this in the above invention, the first board is a probe card which are mounted with needles which devices under test electrically contact, the second board is an interface apparatus body to which the probe card is mounted, the interface apparatus body relays electrical connections between the devices under test and a test head body, and the engaging means is held at the interface apparatus body and is able to linearly move toward the probe card (see claim 6).

As another specific configuration of the link mechanism, the link mechanism comprises: a link having a support point fixed in a rotatable manner; a first joint rotatably coupling one end of the link with the drive shaft of the actuator; and a second joint rotatably coupling other end of the link with the engaging means (see claim 7).

While not particularly limited to this in the above invention, the first board is an interface apparatus relaying electrical connections between devices under test and a test head body, the second board is the test head body to which the interface apparatus is detachably mounted, and the engaging means is held at the test head body and is able to linearly move along a direction substantially parallel to a main surface of the interface apparatus (see claim 8).

DESCRIPTION OF NOTATIONS

Figure 1:
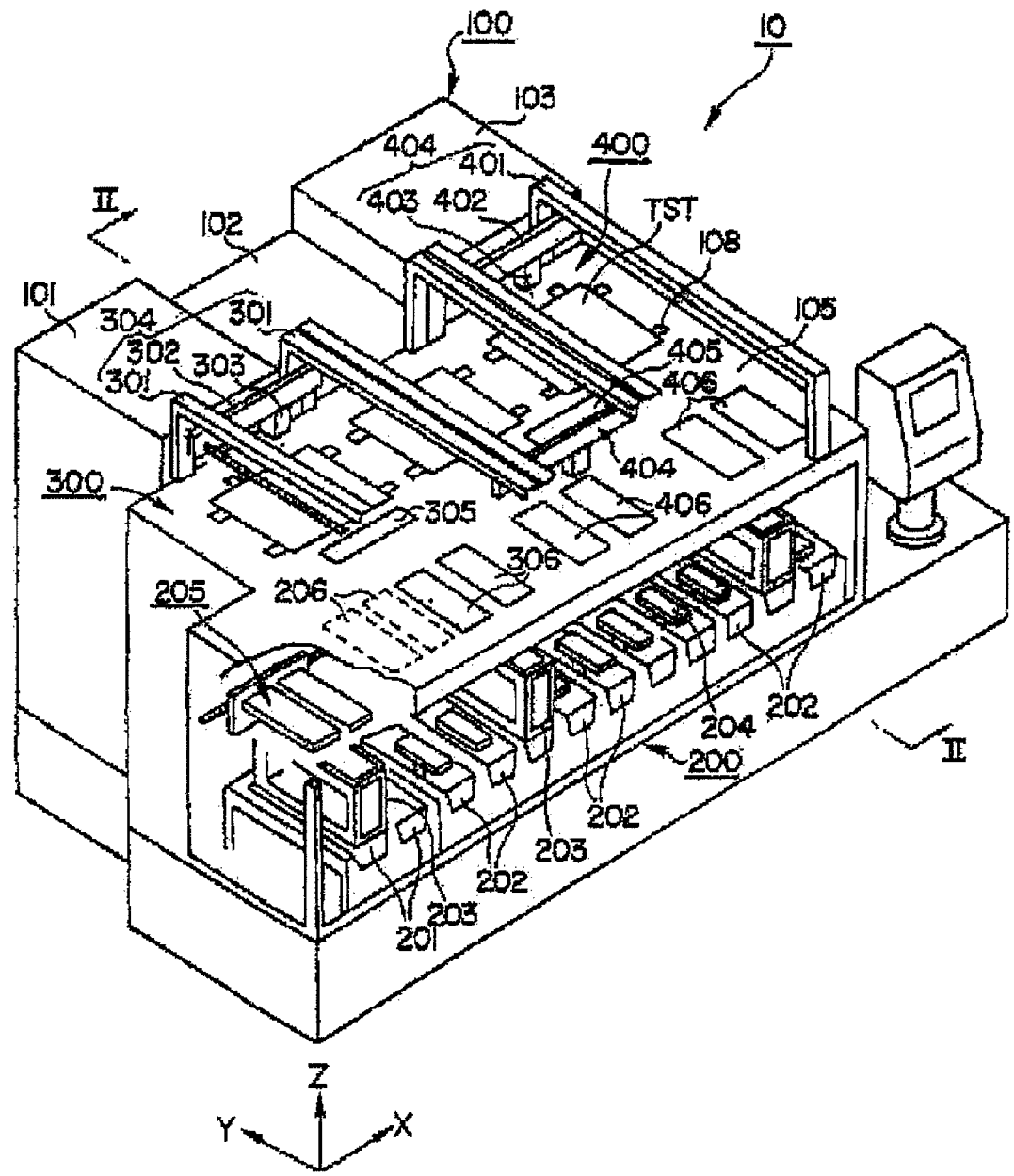
FIG. 1 is a perspective view showing an entire electronic device test system according to an embodiment of the present invention.

1 . . . electronic device test system
4 . . . test head
41 . . . test head body
43 . . . engagement member
44 . . . HiFix attachment apparatus
441 . . . air cylinder
441a . . . drive shaft
442 . . . insertion pins
443 . . . plate member
444 . . . linear guide
450 . . . link mechanism
451 . . . link
451a, 45b . . . extendable parts
452, 453 . . . first and second joints
454 . . . support point
5 . . . HiFix
501 . . . DSA (Device Specific Adapter)
510 . . . HiFix body
520 . . . DSA attachment apparatus
521 . . . air cylinder
522 . . . engagement shaft
530 . . . link mechanism 531 to 533 . . . first to third links
534 to 537 . . . first to fourth joint
538 . . . support point

BEST MODE FOR CARRYING OUT THE INVENTION

Below, embodiments of the present invention will be explained based on the drawings.

Figure 2:
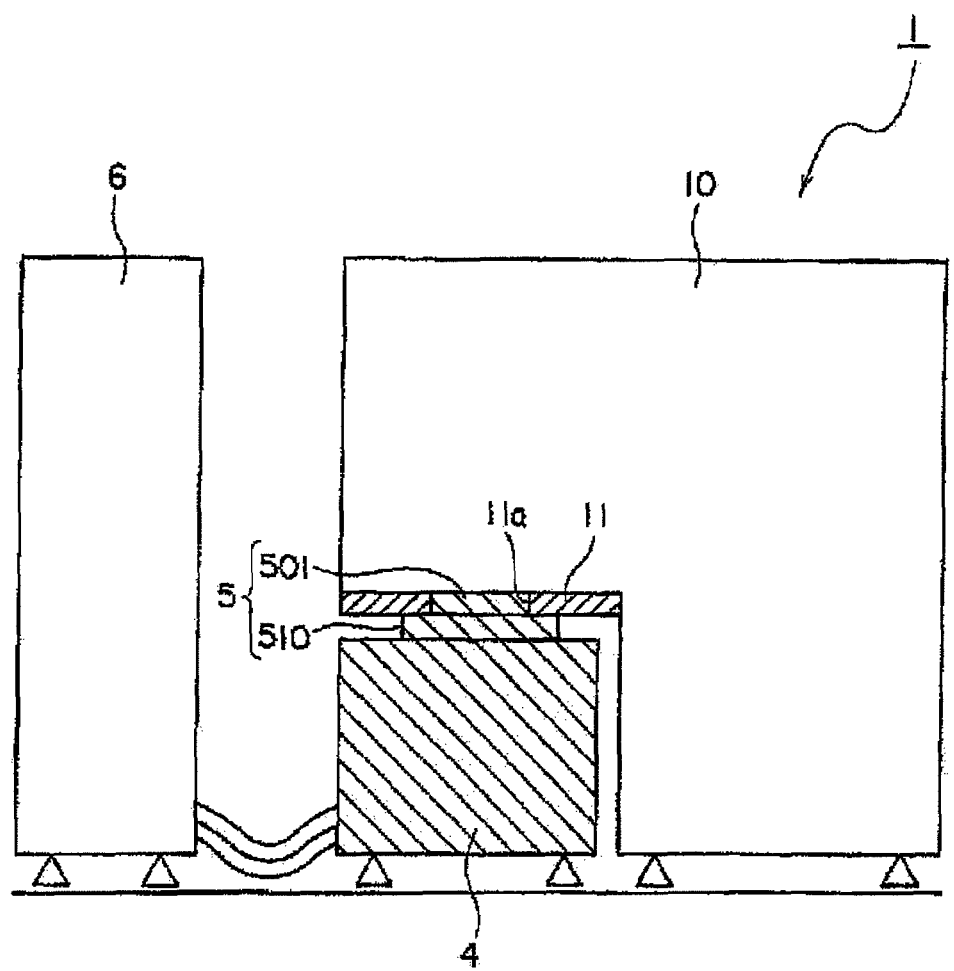
FIG. 2 is a schematic cross-sectional view along the line II-II of FIG. 1.
Figure 3:
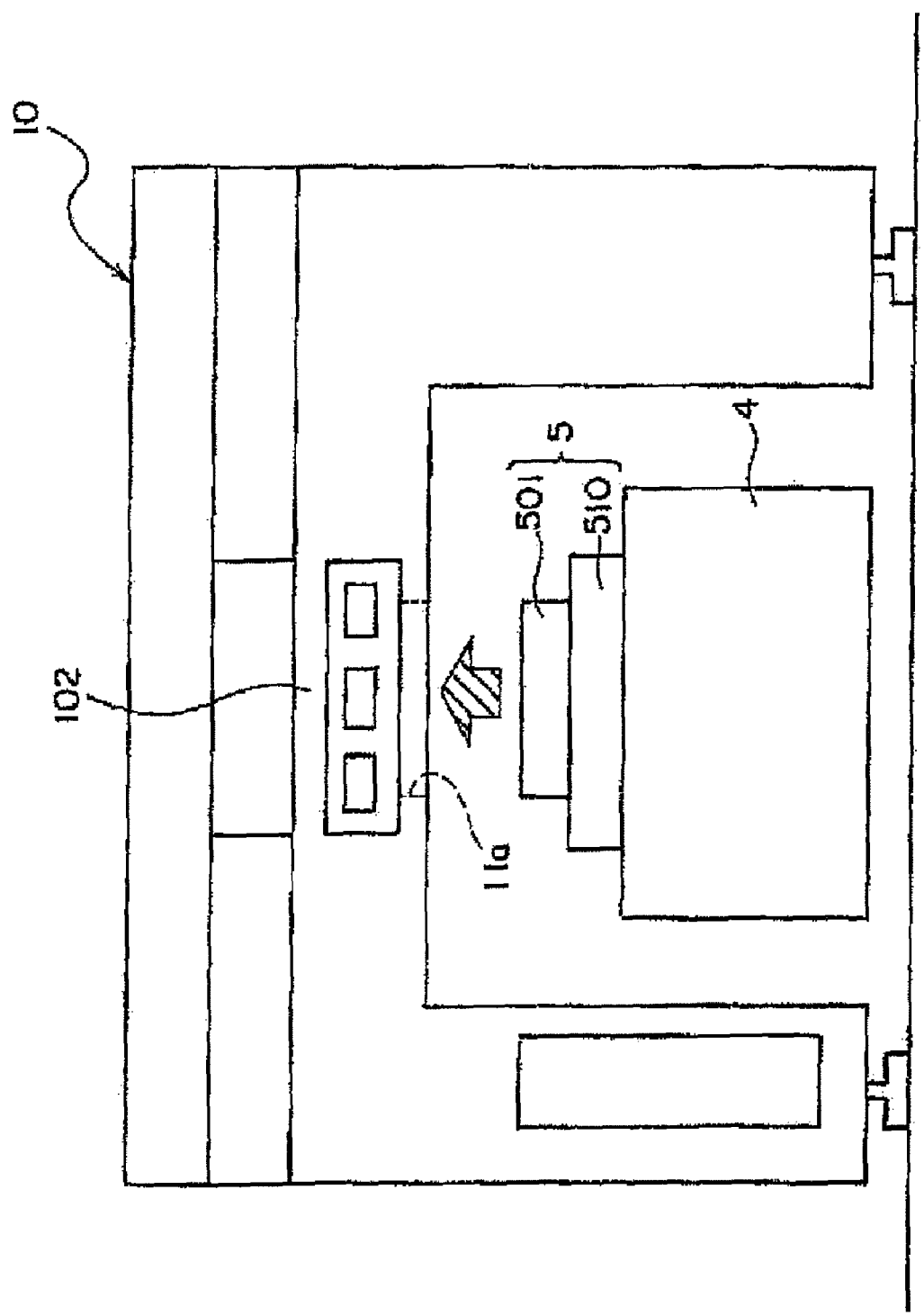
FIG. 3 is a back view of the electronic device test system shown in FIG. 1.

FIG. 1 is a perspective view showing an entire electronic device test system according to an embodiment of the present invention. FIG. 2 is a schematic cross-sectional view along the line II-II of FIG. 1. FIG. 3 is a back view of the electronic device test system shown in FIG. 1. First, the overall configuration of an electronic device test system according to the present embodiment will be explained briefly with reference to these FIG. 1 to FIG. 3.

The electronic device test system 1 according to the present embodiment, as shown in FIG. 1 and FIG. 2, comprises: a handler 10 for handling ICs under test; a test head 4 with which ICs under test are brought into electrical contact; and a tester 6 sending test signals to this test head 4 to test the ICs under test.

The handler 10 is an apparatus which applies high temperature or low temperature thermal stress to the ICs, brings them into electrical contact with sockets 506 which side with a HiFix 5, tests the ICs by the tester 6 in that state, and classifies the ICs based on information of the test results from that tester 6. Further, it reloads ICs under test from a user tray holding large numbers of ICs under test (hereinafter referred to as a "customer tray") to a test tray conveyed circulated inside the handler 10 for conveyance, heating/cooling, testing, and classification.

A test tray is loaded with ICs under test at a loader unit 300, then is sent into a chamber unit 100. In the state carried on the test tray, the ICs under test are brought into contact with the sockets 506 of the test head 4 and tested in the chamber unit 100. The post-test ICs under test are conveyed to an unloader unit 400, then the ICs under test is reloaded to the customer trays in accordance with the test results in the unloader unit 400.

The chamber unit 100 comprises: a constant temperature tank 101 for applying the desired high temperature or low temperature thermal stress to the ICs under test loaded on a test tray; a test chamber 102 for pushing the ICs under test to the test head 4 in a state given thermal stress in this constant temperature tank 101; and a thermal stress-relieving tank 103 for relieving the thermal stress applied from the IC devices tested at the test chamber 102.

When applying a high temperature in the constant temperature tank 101, air is blown against the ICs under test to cool them and return them to room temperature in the thermal stress-relieving tank 103. On the other hand, when applying a low temperature of for example about −30° C. in the constant temperature tank 101, in the thermal stress-relieving tank 103, the ICs under tests are heated by hot air or a heater etc. to return them to a temperature of an extent where no condensation will occur. Further, the ICs under test from which the stress was relieved are conveyed to the unloader unit 400.

As shown in FIG. 2 and FIG. 3, an opening 11a is formed at the substantial center of the base unit 11 of the handler 10 forming the bottom surface of the test chamber 102 A HiFix 5 mounted on the top of the test head 4 is connected to the opening 11a. A test tray is carried to above the sockets 506 of the HiFix 5, then the large number of ICs under test on the test tray are simultaneously electrically brought into contact with the HiFix 5 (strictly speaking, the contact pins of the sockets 506) so as to conduct the tests. The results of the tests are stored at addresses determined for example by the identification number assigned to the test tray and the numbers of the ICs under test assigned inside the test tray. A test tray finished being tested is thermally relieved in the thermal stress relieving tank 103, then conveyed to the unloader unit 400 after the temperatures of the IC devices return to room temperature.

The IC storage unit 200 comprises: pre-test IC stockers 201 for storing pre-test IC devices; and post-test IC stockers 202 storing IC devices classified in accordance with the test results.

The pre-test IC stockers 201 and the post-test IC stockers 202 have tray support frames 203 and elevators 204 able to enter the tray support frames 203 from the bottoms and ascend toward the tops. The tray support frames 203 support pluralities of not shown customer trays stacked together. These stacked customer trays are able to move up and down by the elevators 204.

The pre-test IC stocker 201 holds a stack of customer trays holding pre-test IC devices. The post-test IC stocker 202 holds a stack of customer trays holding post-test IC devices stored in accordance with the test results.

The above-mentioned customer trays are carried into the loader unit 300. In this loader unit 300, ICs under test are reloaded to the test tray.

As a conveyance system reloading ICs under test from a customer tray to the test tray, as shown in FIG. 1, an XY-conveyance system 304 is used, an XY-conveyance system 304 comprises: two rails 301 provided on the top of a base plate 105; a movable arm 302 able to move by these two rails 301 back and forth between the test tray and the customer tray (this direction being defined as the Y-direction); and a movable head 303 supported by this movable arm 302 and able to move along the movable arm 302 in the X-direction.

The movable head 303 of this XY-conveyance system 304 has pickup heads attached to it. Due to the pickup operation of the pickup heads, ICs under test are reloaded from the customer tray to the test tray. For example, the movable head 303 has eight pickup heads mounted on it and can reload eight ICs under test to the test tray at a time.

A pair of windows 306, 306 are formed at the base plate 105 of the loader unit 300 so that customer trays carried to the loader unit 300 can approach the top surface of the base plate 105. While the illustration is omitted, each window 306 is provided with holding hooks for holding a customer tray carried to that window 306. A customer tray is held at a position with the top surface of the customer tray approaching the surface of the base plate 105 through a window 306.

Further, an elevator table for raising and lowering a customer tray is provided below each window 306. This elevator table lowers a customer tray emptied by unloading of pre-test IC devices and transfers it to the tray transport arm 205.

The unloader unit 400 is also provided with an XY-conveyance system 404 of the same structure as the XY-conveyance system 304 provided at the loader unit 300. This XY-conveyance system 404 reloads post-test ICs under test from the test tray conveyed to the unloader unit 400 to the customer tray.

Two pairs of windows 406 are formed at the base plate 105 of the unloader unit 400 so that the customer tray carried to the unloader unit 400 can approach the top surface of the base plate 105. While the illustration is omitted, each window 406 is provided with holding hooks for holding a customer tray carried to the window 406. A customer tray is held at a position with the top surface of the customer tray approaching the surface of the base plate 105 through a window 406.

Further, elevator tables for raising and lowering the customer tray are provided below the windows 406. These elevator tables lower the customer tray filled by post-test IC devices and transfer them to the tray transport arm 205.

As shown in FIG. 1, at the top of the pre-test IC stockers 201 and post-test IC stockers 202, a tray transport arm 25 moving across the entire range in the direction of arrangement of the pre-test IC stockers 201 and post-test IC stockers 202 is provided between them and the base plate 105.

This tray transport arm 205 comprises a pair of tray holders for holding the customer trays arranged at the left and right and transports the customer trays among the loader unit 300, the unloader unit 400, the pre-test IC stockers 201 and the post-test IC stockers 202.

Next, a test head of an electronic device test system according to the present embodiment will be explained.

Figure 4:
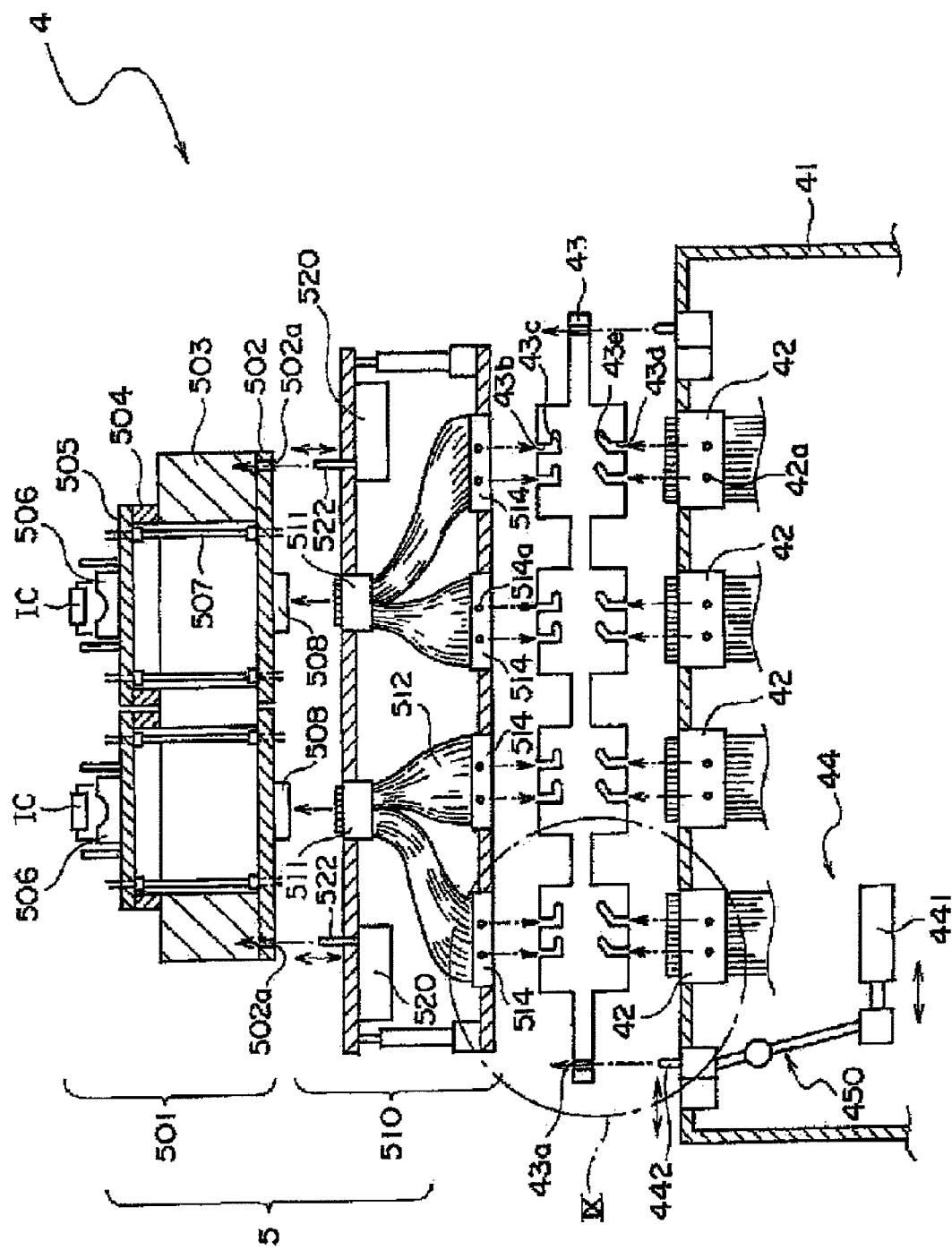
FIG. 4 is a detailed cross-sectional view showing a test head according to an embodiment of the present invention.
Figure 5A:
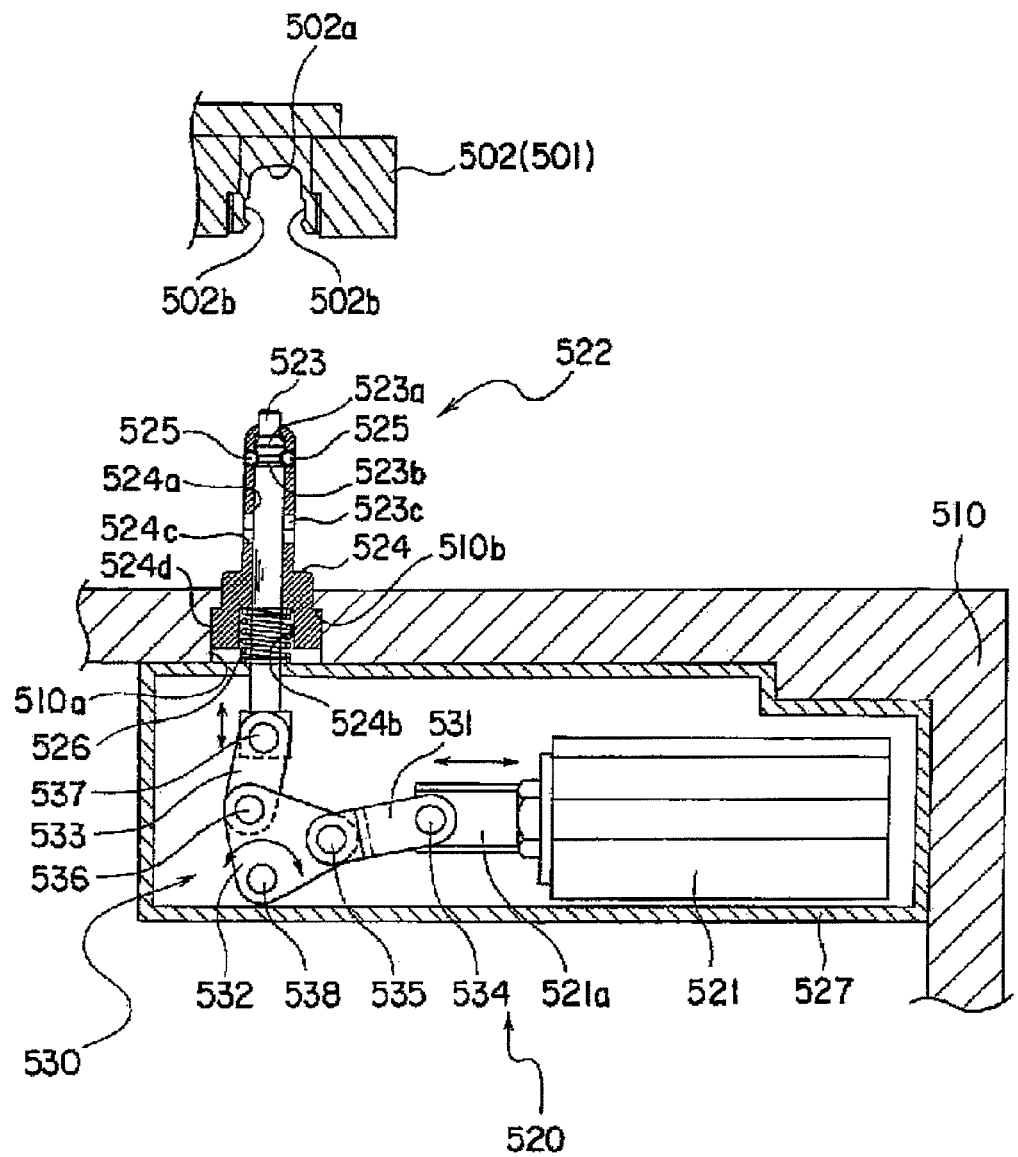
FIG. 5A is a cross-sectional view showing a DSA attachment apparatus according to an embodiment of the present invention and shows the state where the DSA is detached from the HiFix body.
Figure 5B:
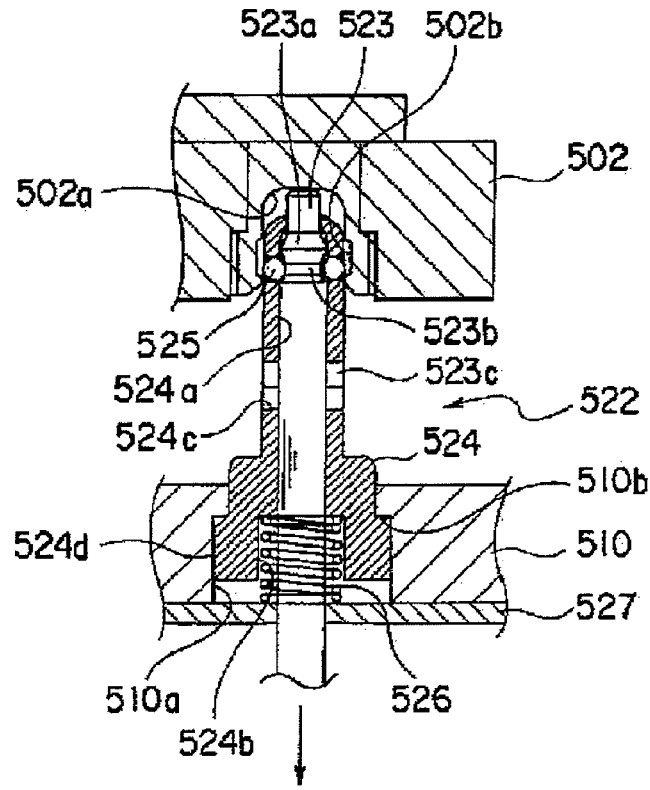
FIG. 5B is an enlarged cross-sectional view showing an engagement shaft of a DSA attachment apparatus according to an embodiment of the present invention and shows the process of attachment of the DSA to the HiFix body (part 1).
Figure 5C:
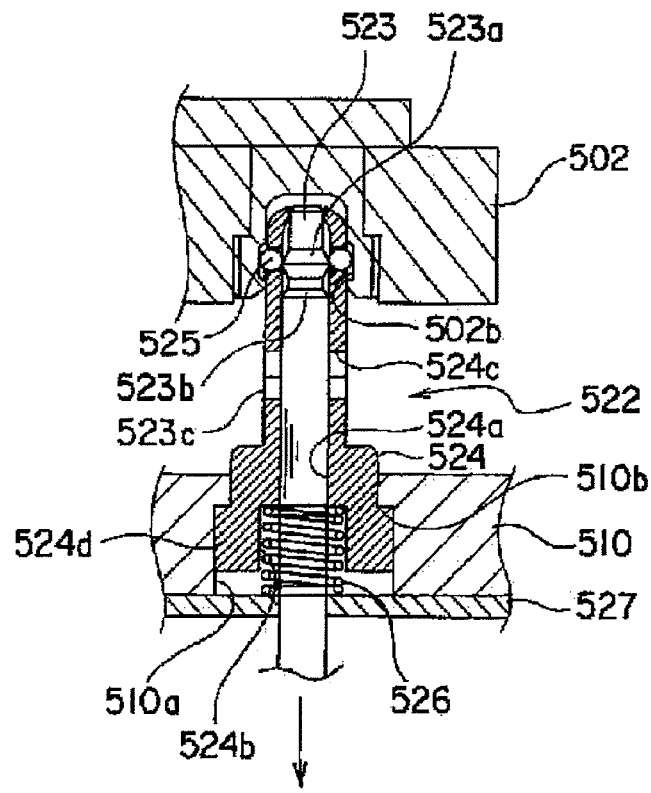
FIG. 5C is an enlarged cross-sectional view showing an engagement shaft of a DSA attachment apparatus according to an embodiment of the present invention and shows the process of attachment of the DSA to the HiFix body (part 2).
Figure 5D:
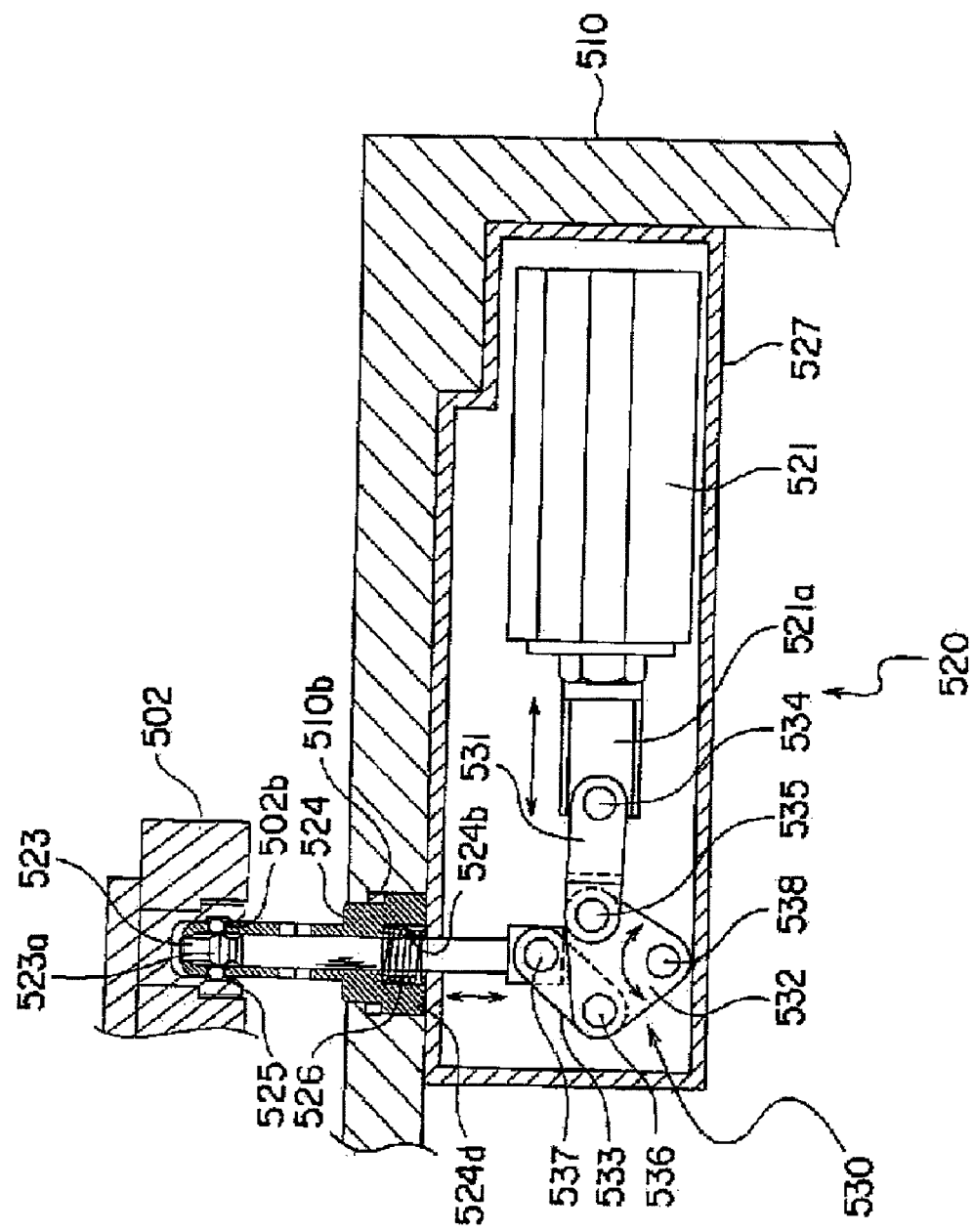
FIG. 5D is a cross-sectional view showing a DSA attachment apparatus according to an embodiment of the present invention and shows the state with the DSA is attached to the HiFix body.
Figure 6:
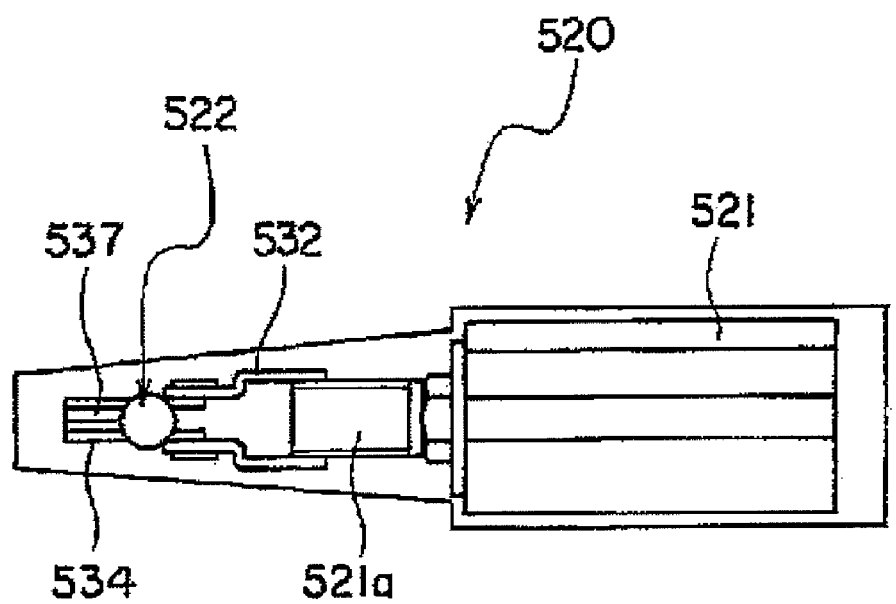
FIG. 6 is a top view of the DSA attachment apparatus shown in FIG. 5A.
Figure 7A:
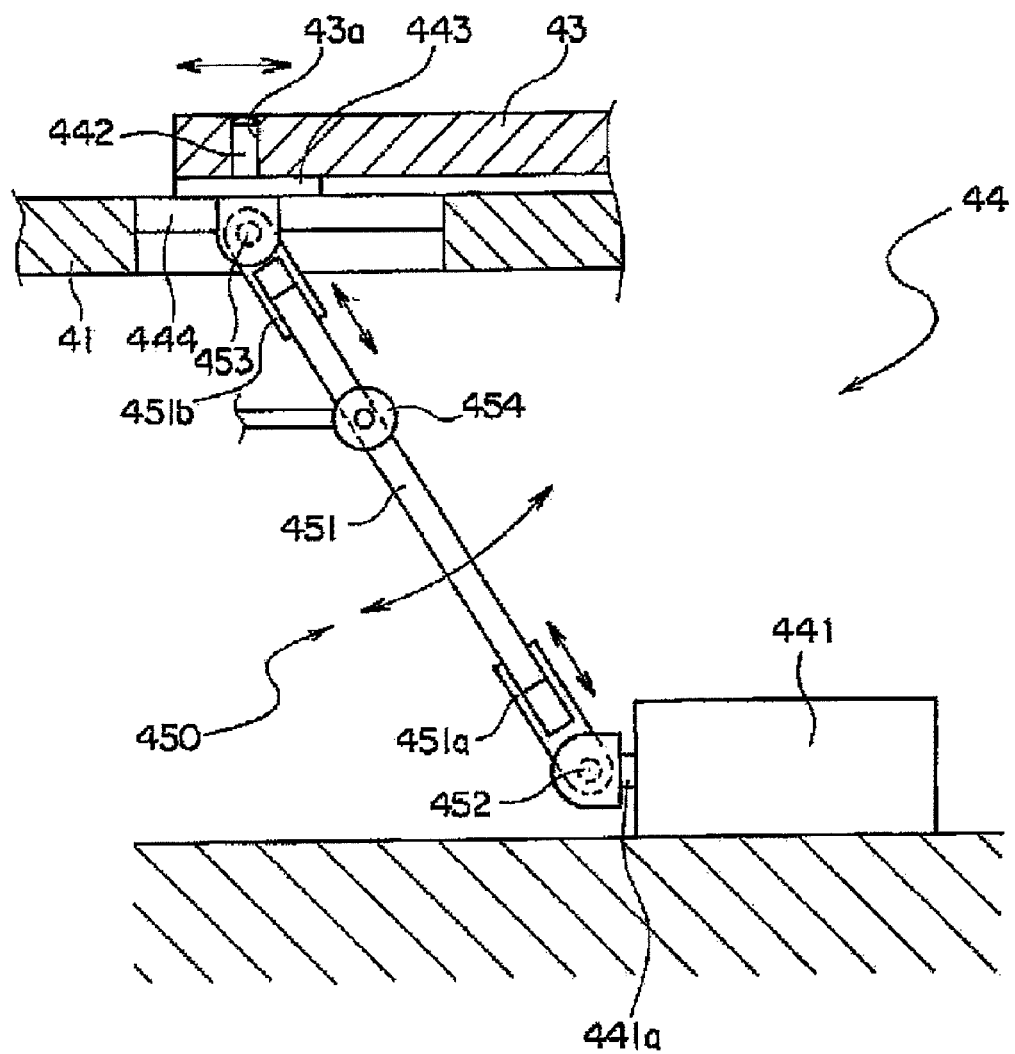
FIG. 7A is a side view of a HiFix attachment apparatus according to an embodiment of the present invention and shows the state of a HiFix attached to a test head body.
Figure 7B:
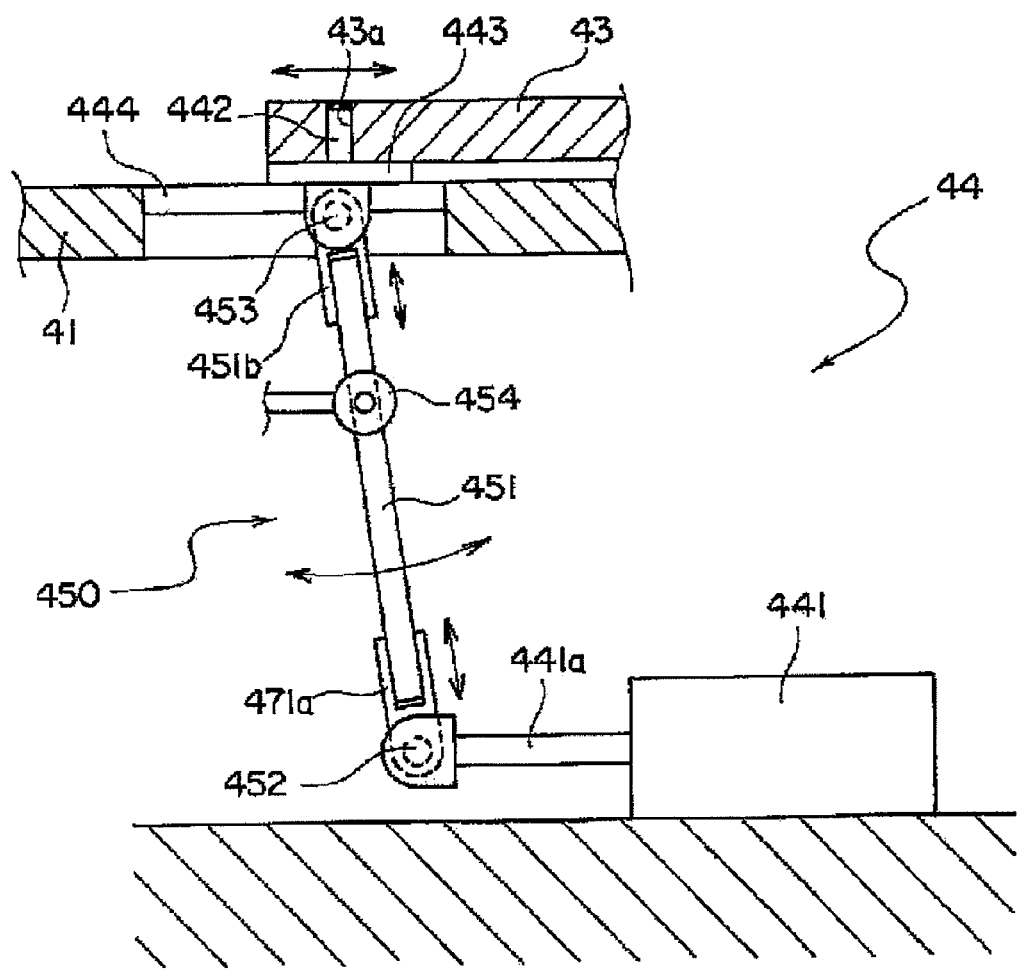
FIG. 7B is a side view of a HiFix attachment apparatus according to an embodiment of the present invention and shows the state of a HiFix detached from a test head body.
Figure 8:
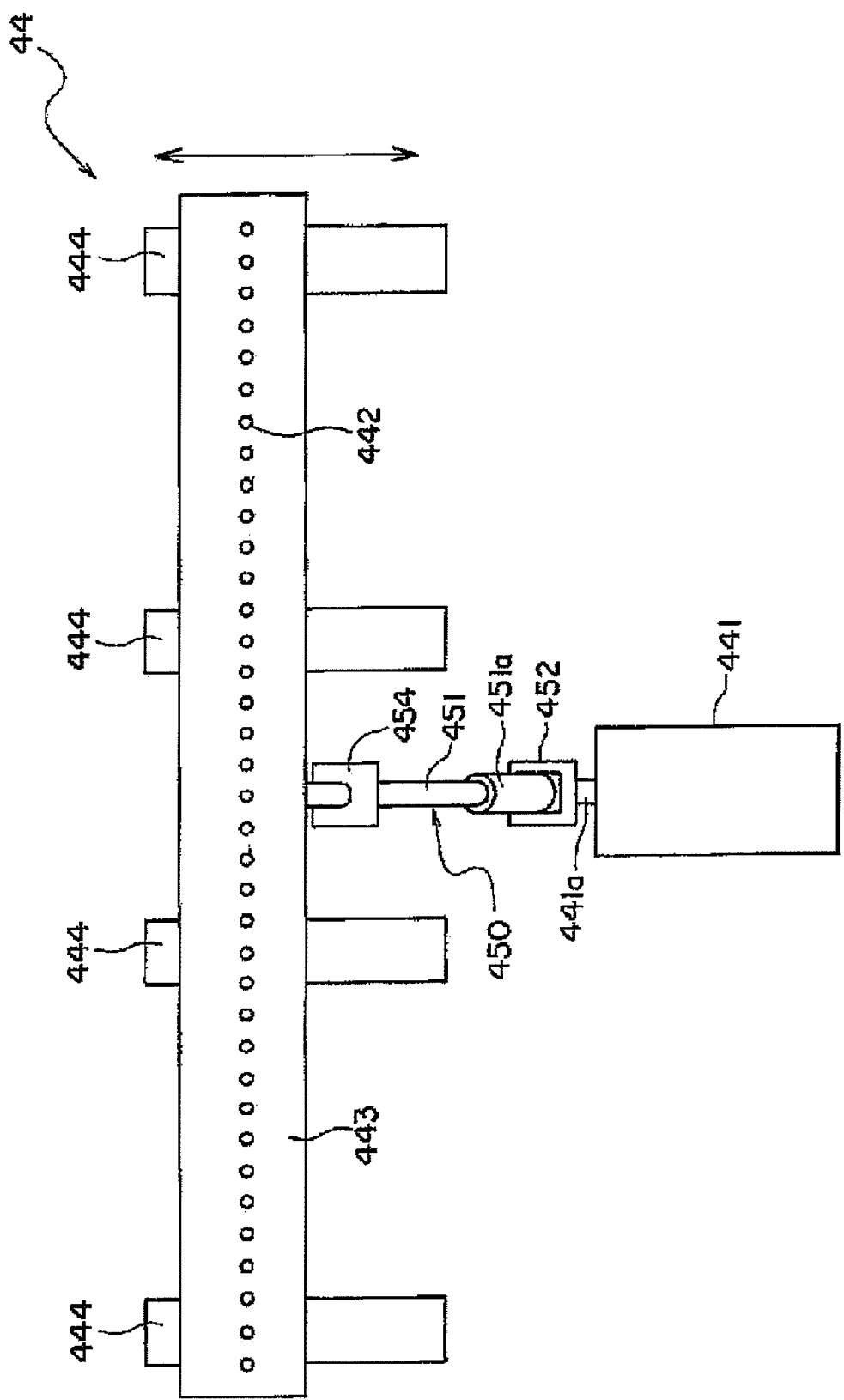
FIG. 8 is a top view of a HiFix attachment apparatus shown in FIG. 7A and FIG. 7B.

FIG. 4 is a detailed cross-sectional view showing a test head according to an embodiment of the present invention, FIG. 5A is a cross-sectional view showing a DSA attachment apparatus according to an embodiment of the present invention and shows the state where the DSA is detached from the HiFix body, FIG. 5B and FIG. 5C are enlarged cross-sectional views showing an engagement shaft of a DSA attachment apparatus according to an embodiment of the present invention and shows the process of attachment of the DSA to the HiFix body, FIG. 5D is a cross-sectional view showing a DSA attachment apparatus according to an embodiment of the present invention and shows the state with the DSA is attached to the HiFix body, FIG. 6 is a top view of the DSA attachment apparatus shown in FIG. 5A, FIG. 7A and FIG. 7B are sides views of a HiFix attachment apparatus according to an embodiment of the present invention, FIG. 7A is a view showing the state of a HiFix attached to a test head body, FIG. 7B is a view showing the state of a HiFix detached from the test head body, FIG. 8 is a top view of a HiFix attachment apparatus shown in FIG. 7A and FIG. 7B, and FIG. 9A to FIG. 9C are views showing HiFix attachment work in an embodiment of the present invention and give enlarged cross-sectional views of the part IX of FIG. 4.

The test head 4, as in the example of the structure shown in FIG. 4, comprises: a HiFix 5 for relaying electrical connections between the ICs under test and the test head body 41; and the test head body 41 to the top of which the HiFix 5 is attached in a detachable manner.

Furthermore, the HiFix 5 comprises: a HiFix body 510 mounted on the top of the test head 41 and a DSA (Device Specific Adapter) 501 mounted on the top of the HiFix body 510.

Note that the HiFix 5 in the present embodiment is equivalent to the interface apparatus in the claims, the HiFix body 510 in the present embodiment is equivalent to the interface apparatus body in the claims, and the DSA 501 in the present embodiment is equivalent to the device specific adapter in the claims.

The DSA 501 comprises a spacing frame 503 provided on the top of an relay board 502; and a socket board 505 provided on the top of the spacing frame 503 via a socket board spacer 504. The sockets 506 are mounted on the socket board 505 so as to correspond to the array of ICs under test held on the test tray. Note that the internal structure of the DSA 501 shown in FIG. 4 is one example.

The relay board 502 and the socket board 505 are connected by a connector board 507. Also, the relay board 502 is provided with DSA side connectors 508. The DSA side connectors 508 are attached to upper connectors 511 provided on the HiFix body 510, whereby the DSA side connectors 508 are connected to coaxial cables 512. Due to this, the DSA 501 and the HiFix body 510 are electrically connected.

To ensure that all of the DSA side connectors 508 are reliably fit with the upper connectors 508 when attaching the DSA 501 to the top of the HiFix body 510, DSA attachment apparatus 520 are provided at the HiFix body 501.

Each DSA attachment apparatus 520, as shown in FIG. 5A to FIG. 6, comprises: an air cylinder 521 having an extendable drive shaft 521a; a link mechanism 530 whose a force input point is coupled with a front end of the drive shaft 521a; and an engagement shaft 522 coupled with a force output point of the link mechanism 530 and able to engage with a bottom surface 502 of the DSA 501. The engagement shaft 522 is held in a linearly movable manner by a through hole 510a formed in the top surface of the housing of the HiFix body 510. In this DSA attachment apparatus 520, the drive force input from the air cylinder 521 is transmitted by rotary motion of the link mechanism 530 so that the engagement shaft 522 can move in the up-down direction. Note that instead of the housing of the HiFix body 510, it is also possible to provide a dedicated member for holding the engagement shaft 522 in a linearly movable manner.

The link mechanism 530 comprises three links 531 to 533 and four joints 534 to 537. One end of the first link 531 is rotatably coupled to the front end of the drive shaft 521a of the air cylinder 521 through the first joint 534. The second link 532 is a substantially triangular shaped plate member. One vertex is rotatably fastened to the HiFix body 510 as the support point 538. The other end of the first link 531 is rotatably coupled with one other vertex of this second link 53 through a second joint 535. One end of the third link 533 is rotatably coupled with the remaining vertex of the second link 532 through a third joint 536. The bottom end of the engagement shaft 522 is rotatably coupled with the other end of the third link 533 through a fourth joint 537.

The engagement shaft 522, as shown in FIG. 5A to FIG. 5D, comprises an inner shaft 523, a lock shaft 524, hard balls 525, and a spring 526. The inner shaft 523 is inserted in the inner bore 524a of the lock shaft 524. Further, through holes passing through the side surface of the lock shaft 524 are formed at a part of that inner bore 524a. The hard balls 525 are provided at the through holes so as to be able to exit and enter from and into the side surface of the lock shaft 524. The inner shaft 523 is designed to be able to move relatively up and down inside the inner bore of the lock shaft 524. Further, this inner shaft 523 is formed with a projecting enlarged diameter part 523a near the hard balls 525. A constricted diameter part 523b is formed below this enlarged diameter part 523a. Usually, the hard balls 525 face the constricted diameter part 523b of the inner shaft 523, however the inner shaft 523 moves relatively downward inside the lock shaft 524 and the enlarged diameter part 523a pushes the hard balls 525 out from the side surfaces of the lock shaft 524, whereby it is possible to engage with the recess part 502b of the engagement hole 502a formed at the bottom surface 502 of the DSA 501. On the other hand, the hard balls 525 separate from the enlarged diameter part 523a, face the constricted diameter part 523b, and enter into the through holes formed in the side surfaces of the lock shaft 524, whereby it is possible to release the engagement between the recess part 502b and the hard balls 525.

A large diameter part 524d larger in inside diameter than the inner bore 524a is formed at the bottom of the inner bore 524a of the lock shaft 524. A spring 526 is inserted into this large diameter part 524d. The bottom of the spring 526 contacts the top surface of the housing 527 of the link mechanism 530. Due to the elastic force of this spring 526, the lock shaft 524 is biased toward the upper direction.

Further, a projecting part 523c projecting out in the radial direction is formed at the approximate center part of the inner shaft 523. As opposed to this, an elongated hole 524c whose long axis are along the axial direction is formed at a position corresponding to the projecting part 524c in the lock shaft 524. The projecting part 523c is inserted into the elongated hole 524c and is able to be moved in the up-down direction.

The above configured engagement shaft 522, as shown in the drawing, is inserted into a through hole 510a of the HiFix body 510. A step part 510b larger than the through hole 510a in inside diameter is formed at the bottom of the through hole 510a. In the above way, the lock shaft 524 is biased upward by the spring 526, however the large diameter part 524d of the lock shaft 524 engages with the step part 510b of the through hole 510a and therefore the action of the spring 526 biasing the lock shaft 524 upward is restricted.

When attaching the DSA 501 to the HiFix body 510, as shown in FIG. 5B, first, the engagement shaft 522 of each DSA attachment apparatus 520 is inserted into the engagement hole 502a formed at the bottom surface 502 of the DSA 501. Note that in this state, the hard balls 525 are housed in the lock shaft 524 with facing the constricted diameter part 523b of the inner shaft 523.

Next, the air cylinder 521 is driven in the direction extending the drive shaft 521a. Due to this drive operation, the first link 531 is pushed, the second link 532 rotates around the support point 538 in the counterclockwise direction in the figure, and the engagement shaft 522 is pulled in the downward direction via the third link 533.

At this time, as shown in FIG. 5C, the lock shaft 524 is biased upward by the spring 526, so the inner shaft 523 moves relatively downward inside the inner bore 524a of the lock shaft 524. Along with this relative movement, the hard balls 525 housed in the lock shaft 524 is pushed out from the side faces of the lock shaft 524 due to the enlarged diameter part 523a of the inner shaft 523 and the hard balls 525 engage with the recessed part 502b of the engagement hole 502a. If the engagement shaft 522 is pulled further in the downward direction by the air cylinder 521 through the link mechanism 530 from this state, the projection 523c of the inner shaft 523 engages with the bottom wall surface of the elongated hole 524c of the lock shaft 524.

Due to this engagement, as shown in FIG. 5D, the force which pulls down the engagement shaft 522 through the link mechanism 530 by the air cylinder 521 overcomes the elastic force of the spring 526, so the engagement shaft 522 as a whole including the lock shaft 524 moves relatively downward with respect to the through hole 510a of the HiFix body 510 and the hard balls 525 engages with the bottom of the recessed part 502b. Due to this engagement, the DSA 501 is pulled toward the HiFix body 510 side and the DSA 501 is attached to the HiFix body 510.

At the time of this pull-in action, the link mechanism 520 is able to increase the drive force input from the air cylinder 521 several-fold by a toggle action and is able to transmit it. Further, the link mechanism 530 transmits the drive force through planar contact at the joints 534 to 537, so there is no need to strengthen the structure compared with the case of use of a conventional cam mechanism.

When detaching the DSA 501 from the HiFix body 510, the air cylinder 521 is driven in the direction shortening the drive shaft 521a from the state shown in FIG. 5D. Due to this drive action, the first link 531 is pulled, the second link 532 turns around the support point 538 in the clockwise direction in the figure, and the engagement shaft 522 is pushed in the upward direction through the third link 533.

If the engagement shaft 522 is pushed in the upward direction, the elastic force of the spring 526 causes the lock shaft 524 to move upward as well. If the large diameter part 524d of the lock shaft 524 abuts against the step part 510b of the HiFix body 510, the inner shaft 523 moves relatively upward with respect to the lock shaft 524 (see FIG. 5C). Due to this relative movement, the hard balls 525 which had been pushed out from the side surface of the lock shaft 524 by the enlarged diameter part 523a of the inner shaft 523 are held in the lock shaft 524 with facing the constricted diameter part 523b of the inner shaft 523 (see FIG. 5B) and the engagement is released, so the DSA 501 can be detached from the engagement shaft 522.

Returning to FIG. 4, lower connectors 514 are provided at the bottom surface of the HiFix 5. The lower connectors 514 are attached to test head body side connectors 42 provided at the top of the test head body 41, whereby the HiFix 5 and a pin electronic card (not shown) are electrically connected through cables.

In the present embodiment, when fitting together the lower connectors 514 and the test head body side connectors 42, the engagement member 43 shown in FIG. 4 is used to fit together the connectors 514, 42. That is, as shown in the drawing, the connectors 514, 42 are provided with projections 514a, 42a projecting out to their sides. Engagement grooves 43b, 43d having bent parts 43c, 43e bent in the same direction are formed at the engagement member 43. Then the projections 514a, 42a are inserted into the straight parts of the engagement grooves 43b, 43d. In that state, the engagement member 43 is slid in the left direction in the figure, whereby the projections 514a, 42a are guided along the bent parts 43c, 43e of the engagement grooves 43b, 43d and the connectors 514, 42 are pulled in and fit together.

A HiFix attachment apparatus 44 for sliding the engagement member 43 in the horizontal direction when attaching the HiFix 5 to the top of the test head body 41 is provided at the test head body 41.

This HiFix attachment apparatus 44, as shown in FIG. 7A to FIG. 8, comprises: an air cylinder 441 having an extendable drive shaft 441a; a link mechanism 450 whose a force input point is coupled with a front end of the drive shaft 441a; a plate member 443 coupled with a force output point of the link mechanism 450; and linear guides 444 linear-movably holding the plate member 443. The plate member 443 is provided with insertion pins 442 to be inserted into insertion holes 43a of the engagement member 43. In this HiFix attachment apparatus 44, the drive force input from the air cylinder 441 is transmitted by rotary motion of the link mechanism 530 so that the engagement member 43 can move in the direction substantially parallel to the bottom surface of the HiFix 5.

The link mechanism 450 comprises one link 451 and two joints 452, 453. The link 451 is rotatably fixed to the test head body 41 at the support point 454 and first and second extendable parts 451a, 451 able to extend along the longitudinal direction are provided at its two ends. Further, the end of the first extendable part 451a is rotatably coupled with the front end of the drive shaft 441a of the air cylinder 441 through the first joint 452. Further, the end of the second extendable part 451b is rotatably coupled through the second joint 453 with the bottom end of the plate member 443 holding the insertion pins 442. The plate member 443 is linear-movably held at the linear guides 444. As shown in FIG. 8, this plate member 443 has a large number of insertion pins 442 arranged in a line at substantially equal intervals.

Figure 9A:
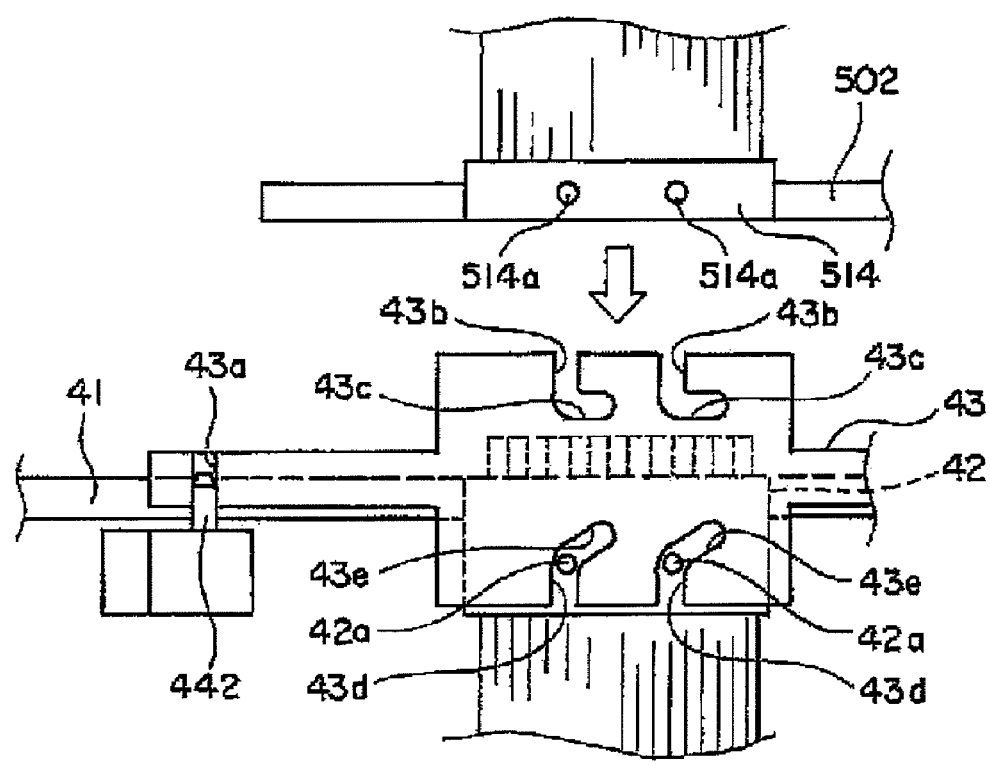
FIG. 9A is an enlarged cross-sectional view showing a first step of HiFix attachment work in an embodiment of the present invention.

When attaching the HiFix 5 to the test head body 41, as shown in FIG. 9A, first, the projections 514a of the lower connector 514 are inserted into the upper grooves 43b of the engagement member 43. Note that the insertion pins 442 of the HiFix attachment apparatus 44 are inserted into the insertion holes 43a of the engagement member 43 so that the engagement member 43 is attached in advance to the test head body 41.

Figure 9B:
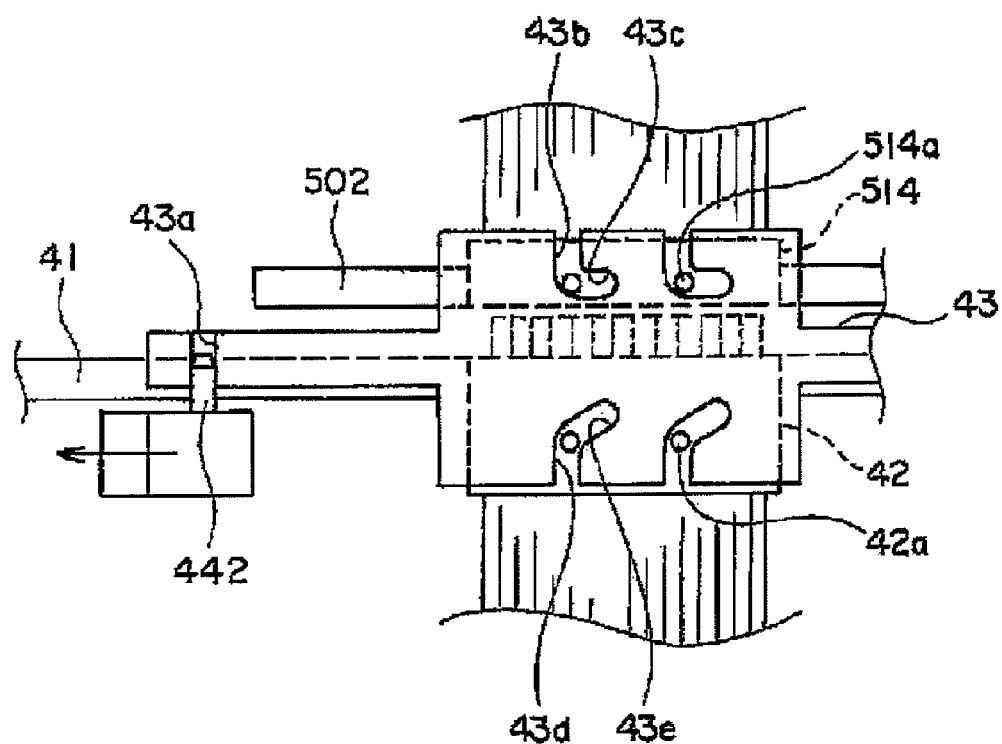
FIG. 9B is an enlarged cross-sectional view showing a second step of HiFix attachment work in an embodiment of the present invention.
Figure 9C:
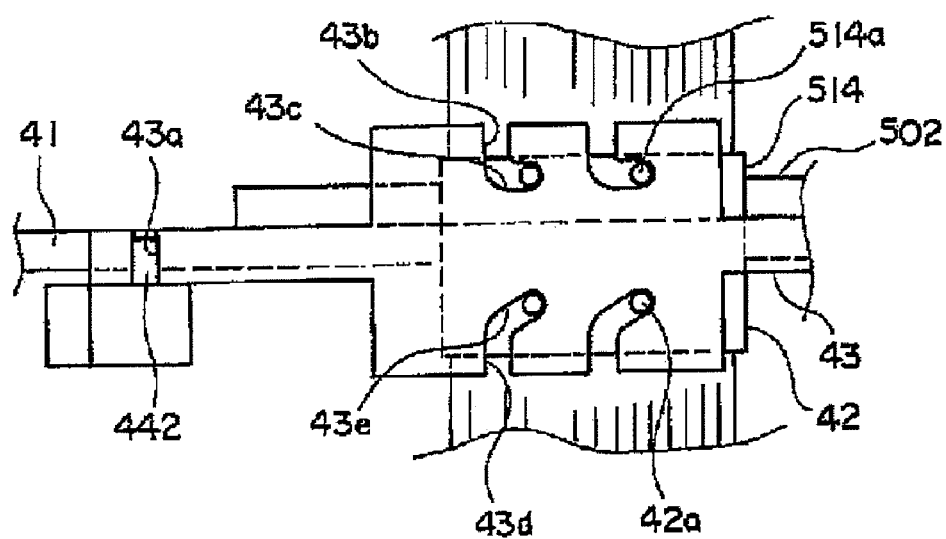
FIG. 9C is an enlarged cross-sectional view showing a third step of HiFix attachment work in an embodiment of the present invention.

The projections 514a of the lower connector 514, as shown in FIG. 9B, are inserted down to the bottom portions of the straight parts of the upper grooves 43b, then the air cylinder 441 is driven in a direction shortening the drive shaft 441a from the state shown in FIG. 7B. Due to this drive operation, the link 451 rotates around the support point 454 counterclockwise in the drawing with extending the first and second extendable parts 451a, 451b, the plate member 443 moves linearly in the left direction in the drawing due to the linear guides 444, and it attains to the state of FIG. 7A. Along with this movement operation of the insertion pins 442, the engagement member 43 also moves and, as shown in FIG. 9C, the projections 514a, 42a move along the bent parts 43c, 43d of the grooves 43b, 43d and the connector 514, 42 are pulled together for engagement. At the time of this pull together operation, the link mechanism 450 can multiply the drive force input from the air cylinder 521 several-fold by the lever principle in accordance with the ratio of distance from the support point 454 to the ends of the links 451 and transmit it. Note that it is also possible to adjust the position of the support point 454 so as to make the reduction ratio of the link mechanism 450 variable.

When detaching the HiFix 5 from the test head body 41, the air cylinder 441 is driven in a direction extending the drive shaft 441a from the state shown in FIG. 7A. Due to this drive operation, the link 451 rotates around the support point 454 in the clockwise direction in the figure with shortening the first and second extendable parts 451a, 451b, the insertion pins 442 move linearly in the right direction in the drawing due to the linear guide 443, the engagement member 43 pulls apart the connectors 514, 42, and the state is set where the HiFix 5 can be detached from the test head body 41.

Note that engagement member need not be made a member independent from the HiFix 5 or test head body 41 and may be fixed to either the HiFix 5 or the test head body 41.

Figure 10A:
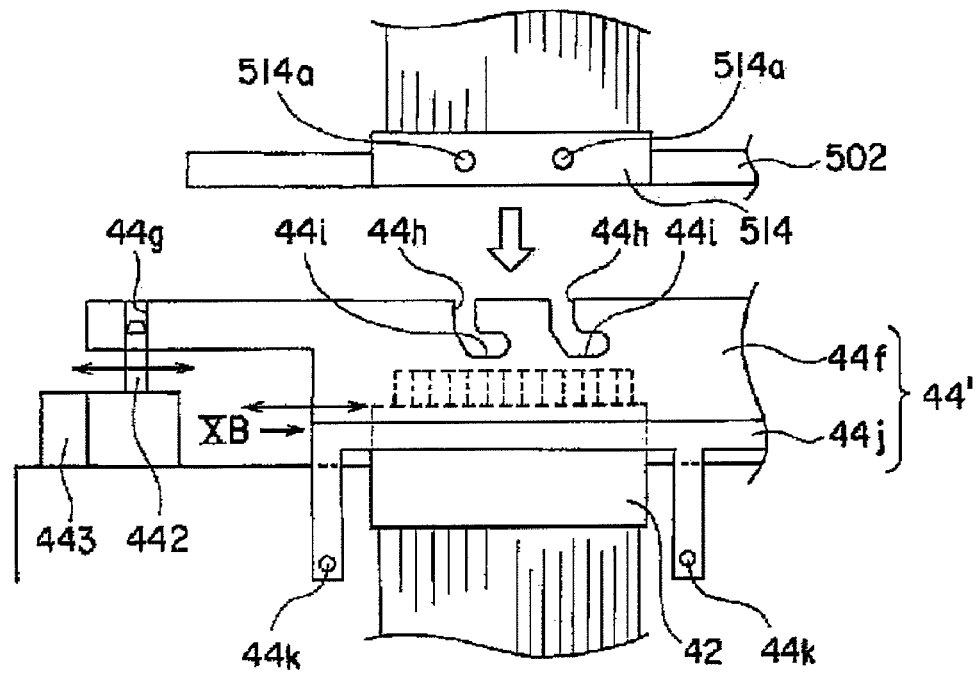
FIG. 10A is a side view showing an engagement member provided at a top of a test head body in another embodiment of the present invention.
Figure 10B:
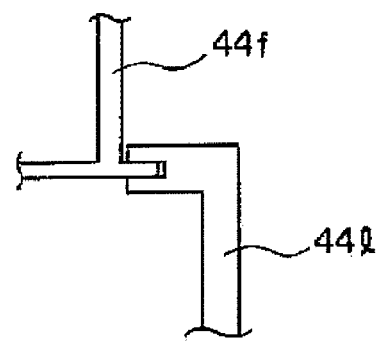
FIG. 10B is an arrow view in the direction XB in FIG. 10A.

FIG. 10A is a side view showing an engagement member provided at a top of a test head body in another embodiment of the present invention. FIG. 10B is an arrow view in the direction XB in FIG. 10A.

An engagement member 43' in another embodiment of the present invention, as shown in FIG. 10A, comprises a slide member 44f and a fixed member 44j. The slide member 44f is formed with two upper grooves 44h having bent parts 44i bent in the right direction in the figure at positions facing the projections 514a of the lower connector 514. Further, an insertion hole 44g into which an insertion pin 42 of the HiFix attachment apparatus 44 can insert is formed at the left end of the slide member 44f in the figure. The fixed member 44j is fixed to the test head body 41 by bolts 44k. As shown in FIG. 10B, the bottom of the slide member 44f is slidably held by the fixing member 44j and can move in the arrow direction shown in FIG. 10A.

In the present embodiment, when attaching the HiFix 5 to the test head body 41, first, the projections 514a of each lower connector 514 are inserted into the upper grooves 44h of the engagement member 43'. Projections 514a of a lower connector 514 are inserted to near the inlets of the bent parts 44i of the upper grooves 44h, then the air cylinder 441 is driven to move the plate member 443 in the left direction of FIG. 10A.

Along with this movement operation, the engagement member 43' also moves in the left direction in the figure, the projections 514a move along the bent parts 44i of the upper grooves 44h, and the lower connector 514 is pulled to the test head side connector 42 and fitted together them.

Figure 11:
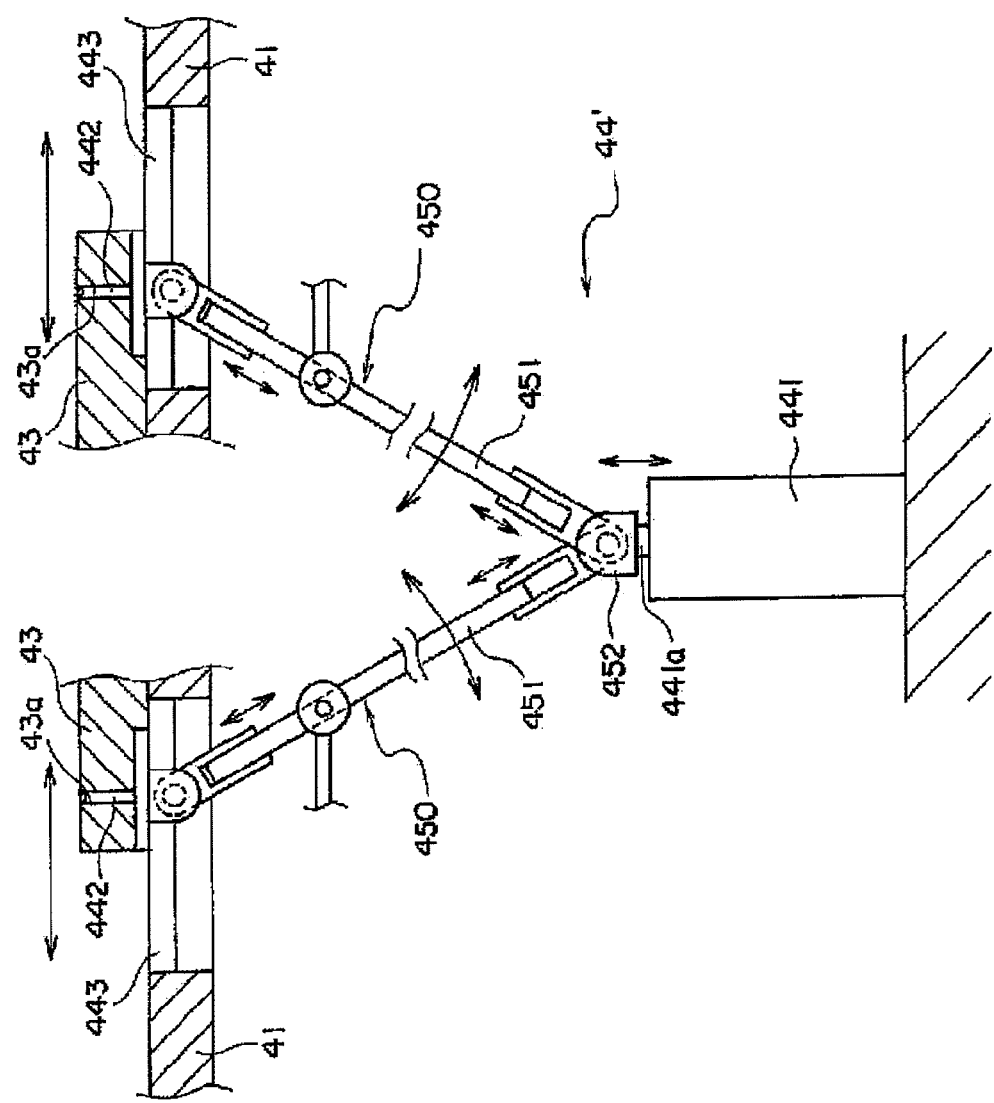
FIG. 11 is a side view of a HiFix attachment apparatus according to a still further embodiment of the present invention.

FIG. 11 is a side view of a HiFix attachment apparatus according to a still further embodiment of the present invention.

When attaching two HiFixes 5 to the top of the test head body 41, the HiFix attachment apparatus 44' shown in FIG. 11 may also be used. This HiFix attachment apparatus 44' comprises two link mechanisms 450 and one air cylinder 441. The air cylinder 441 is provided in a posture so that a drive shaft 441a moves up and down. The front end of the drive shaft 441a is rotatably coupled with the ends of two links 451 through a first joint 452. Further, the engagement member 43 engaging with one HiFix 5 is designed to be moved by one link mechanism 450, while the engagement member 43 engaging with the other HiFix 5 is designed to be moved by the other link mechanism 450. By employing such a configuration, it is possible to reduce the number of air cylinders 441.

The attachment apparatus according to the present invention is not limited to the above-mentioned DSA attachment apparatus or HiFix attachment apparatus. It may also be used for probe card attachment apparatus for attaching or detaching a probe card to or from a HiFix.

Figure 12:
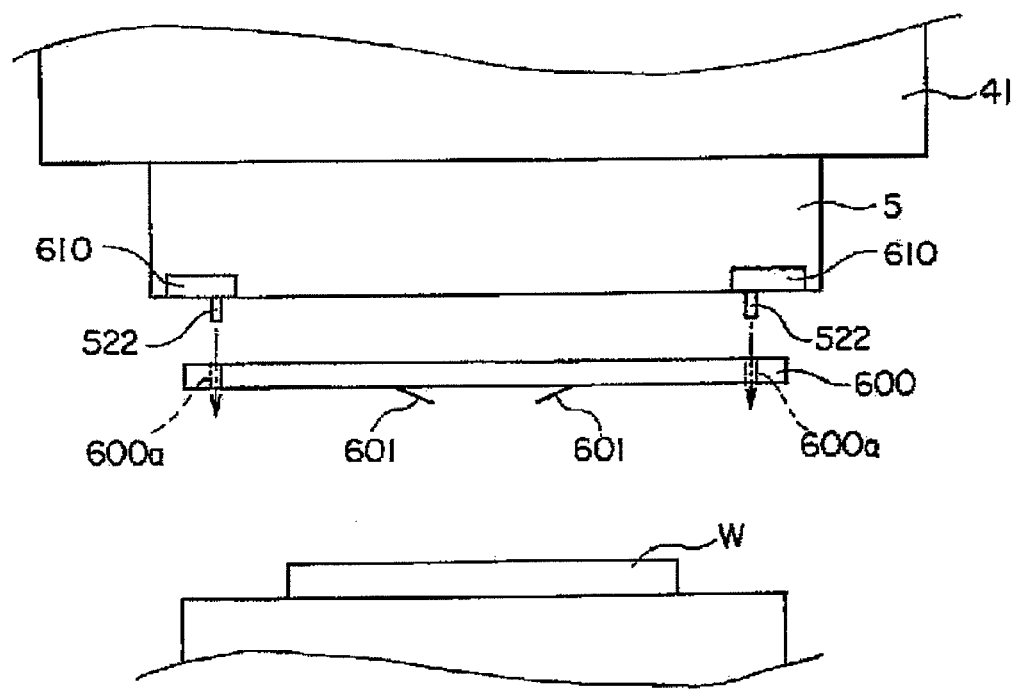
FIG. 12 is a side view showing a probe card attachment apparatus in an embodiment of the present invention.
Figure 13:
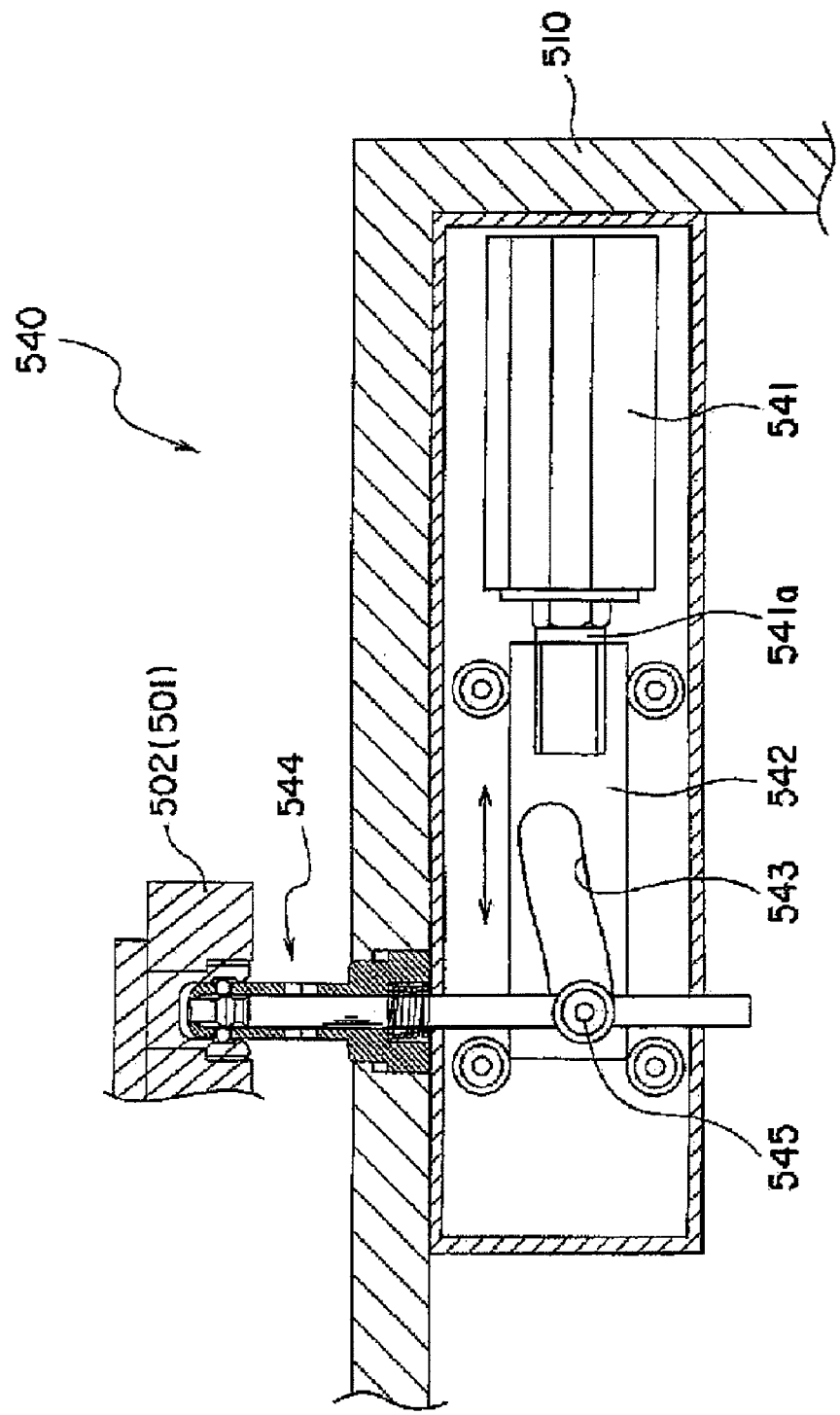
FIG. 13 is a cross-sectional view showing a conventional DSA attachment apparatus.
Figure 14:
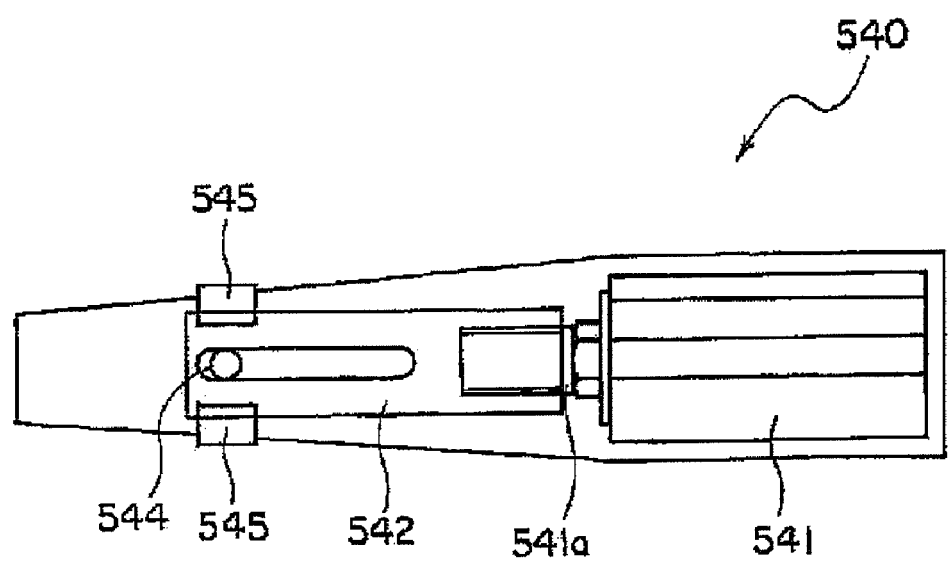
FIG. 14 is a top view showing a conventional DSA attachment apparatus.

FIG. 12 is a side view showing a probe card attachment apparatus in an embodiment of the present invention. This probe card attachment apparatus 610 has a configuration similar to that explained with reference to FIG. 5A to FIG. 6. A large number of needles 601 which electrically contact the wafer W under test are mounted on one main surface of the probe card 600. The engagement shafts 522 inserts into and engages with the engagement holes 600a formed in the another main surface of the probe card 600, then the engagement shafts 522 are pulled by the link mechanism 450, thereby the probe card attachment apparatus 610 can attach the probe card 600 to the HiFix 5.

In particular, in the probe card attachment apparatus 610 according to the present embodiment, use of a link mechanism enables reduction of size to be achieved, so a larger mounting space on the probe card 600 can be secured.

Note that the above-explained embodiments were described in order to facilitate understanding of the present invention and were not described in order to limit the present invention. Therefore, the elements disclosed in the above embodiments include all design modifications and equivalents falling under the technical scope of the present invention.

For example, in the above-mentioned embodiments, an air cylinder whose a drive shaft moves linearly was used as an example of an actuator, but the present invention is not particularly limited to this. For example, it is also possible to use an electric motor, rotary air cylinder or other actuator whose the drive shaft rotates. Alternatively, it is possible not to rely on air, electric power, or other power, but operate the link mechanism manually. When using an actuator whose the drive shaft rotates, for example, it is possible to convert the rotary motion of the drive shaft to linear motion through a ball-screw mechanism etc.

Further, the transmitting means in the present invention is not limited to the link mechanism explained in the above embodiments so long as a mechanism using rotary motion for transmission. It may also be a gear mechanism using rotary gears to reduce the speed or this gear mechanism may be used to make the reduction ratio variable.

The invention claimed is:

1. An attachment apparatus for attaching or removing a first board to or from a second board in a test head comprising the first board and the second board to which the first board is mounted, the attachment apparatus comprising:
an engaging device configured to be able to engage with the first board and held linear-movably;
an actuator supplying a drive force for linearly moving the engaging device; and
a transmitting device interposed between the actuator and the engaging device and configured to transmit the drive force input from the actuator to the engaging device; wherein
the transmitting device transmits the drive force input from the actuator by rotary motion.

2. The attachment apparatus as set forth in claim 1, wherein the transmitting device increases the drive force input from the actuator and transmits it to the engaging device.

3. The attachment apparatus as set forth in claim 1, wherein the transmitting device has a link mechanism whose a point to input the force is coupled with a drive shaft of the actuator and whose a point to output the force is coupled with the engaging device.

4. The attachment apparatus as set forth in claim 3, wherein the link mechanism comprises:
a first link rotatably coupled with the drive shaft of the actuator through a first joint;
a second link having a support point fixed in a rotatable manner and rotatably coupled with the first link through a second joint; and
a third link rotatably coupled with the second link through a third joint and rotatably coupled with the engaging device through a fourth joint.

5. The attachment apparatus as set forth in claim 4, wherein
the first board is a device specific adapter which are mounted with sockets which devices under test electrically contact,
the second board is an interface apparatus body to which the device specific adapter is mounted, the interface apparatus body relays electrical connections between the devices under test and a test head body, and
the engaging device is held at the interface apparatus body and is able to linearly move toward the device specific adapter.

6. The attachment apparatus as set forth in claim 4, wherein
the first board is a probe card which are mounted with needles which devices under test electrically contact,
the second board is an interface apparatus body to which the probe card is mounted, the interface apparatus body relays electrical connections between the devices under test and a test head body, and
the engaging device is held at the interface apparatus body and is able to linearly move toward the probe card.

7. The attachment apparatus as set forth in claim 3, wherein the link mechanism comprises:
a link having a support point fixed in a rotatable manner;
a first joint rotatably coupling one end of the link with the drive shaft of the actuator; and
a second joint rotatably coupling other end of the link with the engaging device.

8. The attachment apparatus as set forth in claim 7, wherein
the first board is an interface apparatus relaying electrical connections between devices under test and a test head body,
the second board is the test head body to which the interface apparatus is detachably mounted, and
the engaging device is held at the test head body and is able to linearly move along a direction substantially parallel to a main surface of the interface apparatus.

9. A test head comprising:
a first board;
a second board to which the first board is mounted; and
an attachment apparatus as set forth in claim 1 for attaching or removing the first board to or from the second board.

10. An electronic device test system for testing electrical characteristics of devices under test,
the electronic device test system comprising:
a test head as set forth in claim 9 electrically connected to the devices under test; and
a tester inputting test signals to the devices under test through the test head to operate them and inspecting their response signals.

* * * * *